United States Patent [19]
Kobayashi et al.

[11] Patent Number: 5,704,975
[45] Date of Patent: Jan. 6, 1998

[54] SELECTIVE CRYSTAL GROWTH METHOD OF COMPOUND SEMICONDUCTOR

[75] Inventors: Ryuji Kobayashi; Hitoshi Hotta, both of Tokyo, Japan

[73] Assignee: NEC Corporation, Tokyo, Japan

[21] Appl. No.: 415,988

[22] Filed: Apr. 4, 1995

[30] Foreign Application Priority Data

Apr. 21, 1994 [JP] Japan .................................. 6-083267

[51] Int. Cl.$^6$ .................................................. C30B 25/02
[52] U.S. Cl. .................... 117/89; 117/84; 117/105
[58] Field of Search ....................... 117/84, 89, 93, 117/95, 105

[56] References Cited

FOREIGN PATENT DOCUMENTS 0548368  6/1993  European Pat. Off. .

OTHER PUBLICATIONS

"Selective Epitaxial Growth of $In_{1-x}Al_xAs$ by Metal–Organic Vapour–Phase Epitaxy," K. Shimoyama et al., Materials Science and Engineering, vol. B17, No. 1–3, 1993, pp. 29–33.

"DFB–LD/Modulator Integrated Light Source by Bandgap Energy Controlled Selective MOVPE," T. Kato et al., Electronics Letters, vol. 28, No. 2, Jan. 16, 1992, pp. 153 and 154.

"Novel Selective Area Growth of AlGaAs and AlAs With HCl Gas by MOVPE," K. Shimoyama et al., Journal of Crystal Growth, 124, 1992, pp. 235–242.

*Primary Examiner*—Felisa Garrett
*Attorney, Agent, or Firm*—Foley, Hoag & Eliot LLP

[57] ABSTRACT

Disclosed herein is a selective metalorganic vapor phase growth method of a group III–V compound semiconductor containing at least Al and In, in which a ratio of an HCl gas supply amount to a supply amount of a group III metalorganic material ([HCl supply amount]/[group III supply amount]) is set in a range of 0.01–0.3. Hence, a polycrystal density is decreased to ensure a selectivity, and a grown crystal composition can be controlled so as not to be excessive in the Al composition so that composition control can be done easily.

7 Claims, 4 Drawing Sheets

SELECTIVE CRYSTAL GROWTH METHOD OF COMPOUND SEMICONDUCTOR

BACKGROUND OF THE INVENTION

The present invention relates to a selective vapor phase growth method of a compound semiconductor, and more particularly, to a selective vapor phase growth method in which a compound semiconductor of a group III–V compound semiconductor containing at least Al and In is selectively grown on a semiconductor substrate the surface of which is partially covered with an insulating film, by means of a metalorganic vapor phase epitaxial growth method (hereinafter, referred to as an MOVPE method) with an HCl gas.

A selective vapor phase growth technique, in which the surface of the semiconductor substrate is partially covered with an insulating film of a silicon nitride or silicon oxide etc. and a semiconductor crystal is grown on the portions of the semiconductor substrate not covered with the insulating film, has been extremely effective for fabricating photonic devices e.g., a laser diode and photonic integrated devices provided by integrating an emitting element and an electrical circuit on the same substrate.

In a case where a formation of a compound semiconductor such as GaAs and InP etc. containing no Al is intended, the compound semiconductor can be formed easily using an ordinary MOVPE method on only the surface portions of the semiconductor substrate, which is not covered with the insulating film. This technique is presented in Electronics Letters Vol. 28 (1992) p. 153.

On the other hand, a selective vapor phase growth of compound semiconductors containing Al such as AlAs and $Al_zGa_{1-z}As$ of a high Al composition using the ordinary MOVPE method has been considered to be very difficult because Al crystal growth species has small volatilities. Therefore, selective vapor phase growth of the compound semiconductors such as AlAs and $Al_zGa_{1-z}As$ of the high Al composition have been carried out by adding a substance containing Cl such as HCl and $AsCl_3$ etc. during the vapor phase growth to provide an aluminium chloride of a high volatility.

Conventionally, in order to obtain sufficient selectivity, a selective vapor phase growth of AlAs and $Al_zGa_{1-z}As$ of the high Al composition has been performed with a ratio of an HCl gas supply amount to a total supply amount of metalorganic group III ([HCl gas supply amount]/[group III material supply amount]) in a range of 0.4–1.0. In addition, as shown in FIG. 1, the Journal of Crystal Growth Vol. 124 (1992) p. 235–242 presents that the compound semiconductor $Al_zGa_{1-z}As$ has different Al compositions in response to whether the HCl gas is added or not. Specifically, FIG. 1 depicts the 4.2K photoluminescence spectra of the $Al_zGa_{1-z}As$ that is grown in two cases where the HCl gas is added and the HCl gas is not added, at a growth temperature of 800° C. It is seen that the luminous wave length is made short showing that the Al composition is increased when the HCl gas is added.

Since a lattice constant of the compound semiconductor $Al_zGa_{1-z}As$ has little dependency on the Al composition so that it can nearly be neglected, lattice mismatch, which is a problem in device fabrication, is not needed to be considered. Therefore, though the Al composition of the compound semiconductor $Al_zGa_{1-z}As$ selectively grown by adding HCl gas is varied, particular problems have not been caused.

On the other hand, a lattice constant of the group III–V compound semiconductor containing at least Al and In, for example $Al_xIn_{1-x}P$, has a large dependency on the Al composition. For this reason, if the lattice mismatch is caused, specifically, if a lattice constant of a substrate is different from that of $Al_xIn_{1-x}P$ formed on the substrate by adding the HCl gas, the $Al_xIn_{1-x}P$ crystal is distorted, and crystal defects are formed when stress strength is above a predetermined value. Hence, when such a crystal produced by adding the HCl gas is applied to the devices, an operation characteristic and operation reliability of the devices will be deteriorated.

Concerning the group III–V compound semiconductor containing at least Al and In, no report of the selective vapor phase growth by adding the HCl gas has been made. However, it is a matter of course that the above described problems are expected. At this time, to cope with the above described problems, it may be sufficient that a supply amount of the metal organic group III material containing Al and In is adjusted during the crystal growth according to an amount of the lattice mismatch obtained by separate experiments. Concerning AlInP and AlGaInP, the lattice constants of which can be matched well with that of a GaAs substrate, and AlInAs, the lattice constant of which can be matched with that of a InP substrate, when the selective vapor phase growths are performed referring to the aforementioned report of AlGaAs, a selectively grown crystal, lattice matched with that of the substrates, can not be formed on the whole area of a 2-inch diameter wafer and it can not be obtained with good reproducibility in every trial.

SUMMARY OF THE INVENTION

An object of the present invention is to provide a selective vapor phase growth method for easily obtaining a selectively grown crystal layer a lattice constant of which matches with that of a substrate of a wide area with a good reproducibility, when a group III–V compound semiconductor containing at least Al and In is selectively grown by means of an MOVPE method in which an HCl gas is used.

In a selective crystal growth method of a compound semiconductor according to the present invention, in which the HCl gas, a group III metalorganic material, and a group V material are supplied on a semiconductor substrate having the surface portion partially covered with an insulating film to form a crystal of a group III–V compound semiconductor containing at least Al and In only on the surface portion of the semiconductor substrate not covered with the insulating film, a ratio of an HCl gas supply amount to a total supply amount of the group III–V metalorganic material ([HCl supply amount]/[group III supply amount]) is set at a range of 0.01 to 0.3.

A function of the selective crystal growth method of the compound semiconductor according to the present invention will be described in detail below.

FIG. 2 shows a relation between an Al composition (Al solid phase ratio) of an $Al_xIn_{1-x}P$ alloy and a ratio of trimethylalminium (TMAl) supply amount to the total supply amount of a group III metalorganic material ([TMAl supply amount]/[group III supply amount]): (an Al gas phase ratio). The $Al_xIn_{1-x}P$ alloy, the lattice constant of which matches with that of a GaAs substrate, is selectively formed on the GaAs substrate with a value of [HCl supply amount]/[group III supply amount] varied from 0 to 1.0.

Under the above described condition, a growth temperature for the $Al_xIn_{1-x}P$ film is 660° C. As is apparent from FIG. 2, when a value of [HCl supply amount]/[group III supply amount] is 0, i.e., without HCl gas, the Al composition increases linearly in proportion to the Al gaseous phase ratio. As a result, it is proved that the Al composition can be controlled easily. However, the curves illustrating the Al composition variation bow upwards with an increase in the value of [HCl supply amount]/[group III supply amount] so that the Al composition becomes excessive. The lattice constant of $Al_xIn_{1-x}P$ matches with that of GaAs, when the composition ratio x (solid phase ratio) is 0.5. However, in the region near 0.5, the solid phase ratio varies rapidly corresponding to the variation of the vapor phase ratio due to the above bowing.

Conventionally, in the range of 0.4 to 1.0 of [HCl supply amount]/[group III supply amount] disclosed as the condition for obtaining a sufficient selectivity in a selective growth of AlGaAs, a fluctuation of the Al gaseous phase ratio results in that of the solid phase ratio of more than 15 times as much as thereof. Considering the degree of precision of a mass flow controller for controlling a supply amount of the present material and the fact that an In organic material (trimethylindium) is supplied mixed with carrier gas after sublimating from a solid state thereof, it is supposed that the Al gaseous phase ratio is controlled with a fluctuation of 1%. This fluctuation of 1% corresponds to a fluctuation of 15% of the solid phase ratio. When the Al composition ratio shifts from a lattice matching condition as much as 15%, it is difficult to obtain a grown layer of more than a thickness of 1 µm having few crystal defects so that fabrication of devices can be hardly realized.

Next, supposing that the Al gaseous phase ratio is controlled within 0.1%, even in this case, it is reasonable to assume that, an ordinary MOVPE apparatus causes a composition change of around 1% derived from reaction tube shapes etc. when 2-inch wafers are used. It must be considered that more than 15 times as much Al composition change corresponding to the gaseous phase ratio results thereof. These facts were not problems in AlGaAs, the lattice constant of which is matched, not depending on the Al composition, with that of the GaAs substrate. This is the reason why the growth technique for AlGaAs could not be applied to AlInP. However, if the value of [HCl supply amount]/[group III supply amount] is adjusted below 0.3, the above-mentioned bowing is comparatively small so that the Al composition can be easily controlled.

When the value of [HCl supply amount]/[group III supply amount] is set at 0.3, the fluctuation of the Al gaseous phase ratio can be controlled within 2.5 times as much fluctuation of the solid phase ratio. So, a grown layer of a thickness more than 1 µm, which has a few lattice defects as well as little Al composition change in the 2-inch diameter surface area of the wafer, can be easily obtained, so that the AlInP layer can be applied to devices. Therefore, when the controllability of the Al composition of the $Al_xIn_{1-x}P$ film is considered, a selectively grown AlInP film for practical use can not be obtained unless [HCl supply amount]/[group III supply amount] is set below 0.3.

An lower limit of [HCl supply amount]/[group III supply amount] will be automatically determined according to a degree of selectivity.

FIG. 3 shows a relation between the number of AlInP polycrystals deposited on a 5 µm wide and 500 µm long silicon nitride mask and [HCl supply amount]/[group III supply amount], when $Al_xIn_{1-x}P$ is selectively grown using HCl gas.

This mask dimension is selected regarding a stripe structure of a laser. When the average number of the polycrystals is below 1, it can be judged that the laser stripe can be formed. At the time of the $Al_xIn_{1-x}P$ crystal growth, the density of the polycrystals decreases rapidly with a little addition of HCl gas so that the degree of selectivity is enhanced. From this result, it is clear that a sufficient selectivity can be obtained when [HCl supply amount]/[group III supply amount] is adjusted above 0.01.

As is apparent from the above-mentioned results, in the selective growth of the $Al_xIn_{1-x}P$ crystal, a selective grown layer applicable to devices can not be obtained unless [HCl supply amount]/[group III supply amount] is set to be above 0.01 for the selectivity and below 0.3 for the composition controllability.

According to the present invention, in the selective crystal growth of the group III compound semiconductor, the degree of the selectivity can be enhanced by adjusting the value of [HCl supply amount]/[group III supply amount] above 0.01, and the Al composition controllability can be enhanced by adjusting it below 0.3 so that the group III–V compound semiconductor can be selectively formed on the substrate having a wide area with high Al composition controllability.

BRIEF DESCRIPTION OF THE DRAWINGS

The above and other objects, advantages and features of the present invention will be more apparent from the following description taken in conjunction with the accompanying drawing in which.

DETAILED DESCRIPTION OF THE PREFERRED EMBODIMENTS

An embodiment of a selective vapor phase crystal growth method according to the present invention will be described below.

In this embodiment, a selective vapor phase crystal growth of AlInP and AlInAs is performed by an MOVPE method, at a low pressure of 70 torr. Trimethylaluminium (TMAl) and trimethylindium (TMIn) are used as a group III material. An Al composition is varied by varying a trimethylaluminium (TMAl) supply amount in a range of $0.03$–$1.80 \times 10^{-5}$ mol/min and keeping a trimethylindium (TMIn) supply amount at a constant value of $1.92 \times 10^{-5}$ mol/min. 100% pure phosphine $PH_3$ and 10% $AsH_3$ diluted by $H_2$ gas are used as group V materials, and 10% HCl diluted with $H_2$ gas is used as an HCl gas source. The amounts of flowing gases of $PH_3$ and $AsH_3$ are 150 sccm and 50 sccm, respectively. An HCl supply amount is varied such that a ratio of the HCl supply amount to the total supply amount of the group III material ([HCl supply amount]/[group III supply amount]) is adjusted in a range 0.01–1.0. $-H_2$ gas is used as a carrier gas for materials, a total amount of flowing gases in a reaction tube is 14.5 l/min. A (001) GaAs surface deviated 2° off toward the [110] direction, is used as a substrate. A silicon nitride film having a thickness of 300 nm, which is deposited on the substrate by means of a plasma chemical vapor deposition method, is used as a mask. A thickness of a crystal growth layer to be formed on the substrate is set at 1 μm. The Al composition of the formed crystal growth layer was obtained by a composition analysis (EPMA) and an X-ray diffraction peak analysis.

Figure 1:
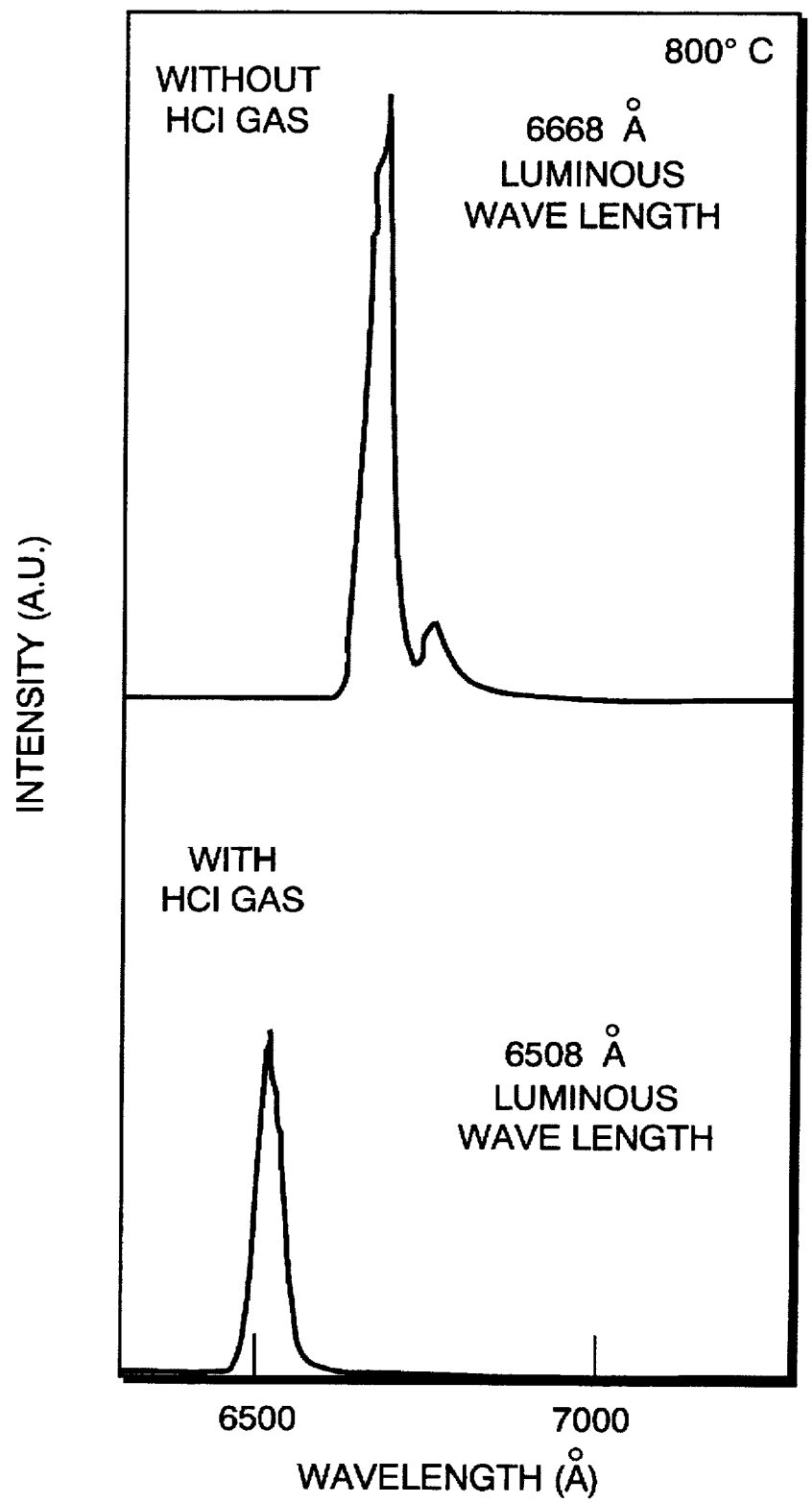
FIG. 1 is a diagram showing 4.2K photoluminescence spectra of $Al_xGa_{1-x}As$ grown with and without HCl gas, at a temperature of 800° C.
Figure 2:
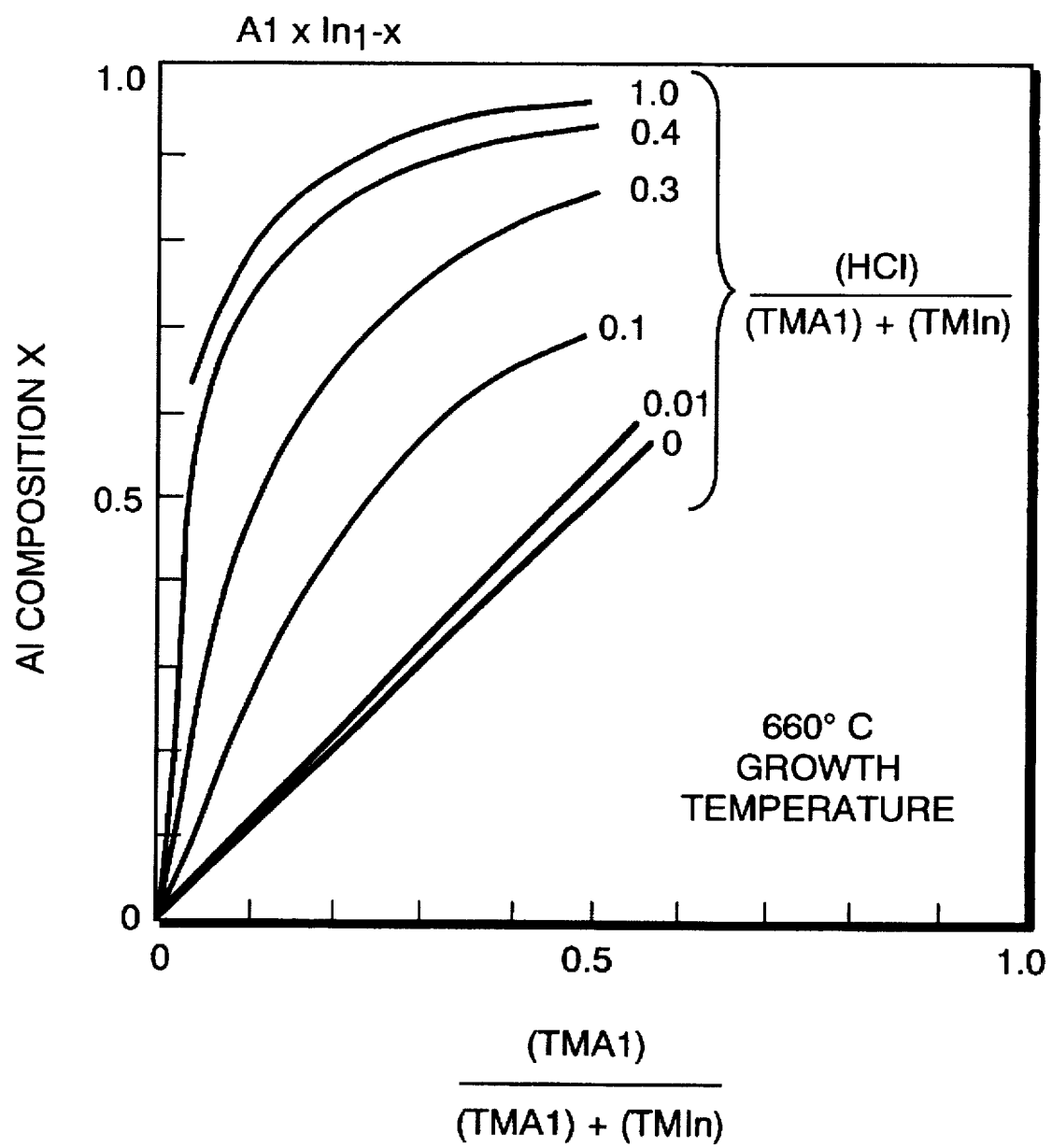
FIG. 2 is a diagram showing a relation between an Al composition of a $Al_xIn_{1-x}P$ film grown at a substrate temperature of 660° C. and a ratio of a TMAl supply amount to a total supply amount of a group III metalorganic material for different ratios of an HCl gas supply amount to the group III metalorganic material.

FIG. 2 depicts a graph in which a relation between the Al composition ratio X (solid phase ratio) and the Al gaseous phase ratio is plotted for different values of [HCl supply amount]/[group III supply amount]. Since an explanation concerning the technical features expressed in FIG. 2 is already done in detail, the explanation thereof will be omitted.

Table 1 shows results of a crystal growth of $Al_{0.5}In_{0.5}P$, the lattice constant of which matches with a (001) surface of the GaAs substrate, employing the present invention and the prior art. Note that, in the present invention, the value of [HCl supply amount]/[group III supply amount] is adjusted at 0.1 and in the prior art, it is adjusted at 0.4. To study an Al composition controllability, an Al composition change was investigated when a ratio (Al gaseous ratio) of TMAl supply amount to a total supply amount of group III metalorganic material was slightly varied. The stability of the Al composition controllability was also studied for crystal growths performed at the same gaseous phase several times. As is apparent from Table 1, when the value of [HCl supply amount]/[group III supply amount] is 0.1 as in the present invention, the Al composition varies in a narrow range of 0.486 to 0.508 when the Al gaseous phase ratio is varied from 0.23 to 0.25. In addition, the Al composition change is small when the crystal growth is repeatedly performed at the same Al gaseous phase ratio of 0.24.

TABLE 1

| $Al_xIn_{1-x}P$ [HCl supply amount] / [group III supply amount] [TMAl] = 0.1 | | $Al_xIn_{1-x}P$ [HCl supply amount] / [group III supply amount] [TMAl] = 0.4 | |
|---|---|---|---|
| [group III] | Al composition X | [group III] | Al composition X |
| 0.23 | 0.486 | 0.02 | 0.372 |
| 0.24 | 0.503 | 0.03 | 0.501 |
| 0.25 | 0.508 | 0.04 | 0.575 |
| 0.24 | 0.503 | 0.03 | 0.521 |
| 0.24 | 0.501 | 0.03 | 0.493 |
| 0.24 | 0.505 | 0.03 | 0.519 |

On the other hand, when the value of [HCl supply amount]/[group III supply amount] is 0.4, the Al composition is greatly varied from 0.372 to 0.575 in accordance with the change of the Al gaseous phase ratio from 0.02 to 0.04. In this case, it is clear that the TMAl supply amount must be controlled precisely. The Al composition change of the crystals formed at the Al gaseous phase ratio of 0.03 largely varies whenever the crystal is formed, leading to the problem of poor reproducibility. Crosshatch-shaped morphology considered to be attributable to lattice deformation is observed at the portion other than the center portion of the wafer of the 2-inch diameter. Therefore, in the case where the lattice matching is required for fabrication of devices, precise control of the AlInP composition is difficult when the value of [HCl supply amount]/[group III supply amount] is 0.4.

As is apparent from the above description of the embodiment, it is proved that the selective vapor phase growth method according to the present invention is excellent in the Al composition controllability for the selective crystal growth of $Al_xIn_{1-x}P$.

The crystal growth of AlInP is described for explaining this embodiment of the present invention. AlGaInP of high Al composition, in which the composition ratio of Al to Ga is more than 2.33, has a nearly the same tendency to the above described AlInP. For this reason, the present invention can be applicable to AlGaInP of high Al composition. In addition, it is considered that the present invention can be applicable to AlGaInP and AlInP when they are grown at the generally used temperature of 630° to 720° C.

Next the second embodiment of the present invention will be described.

Figure 3:
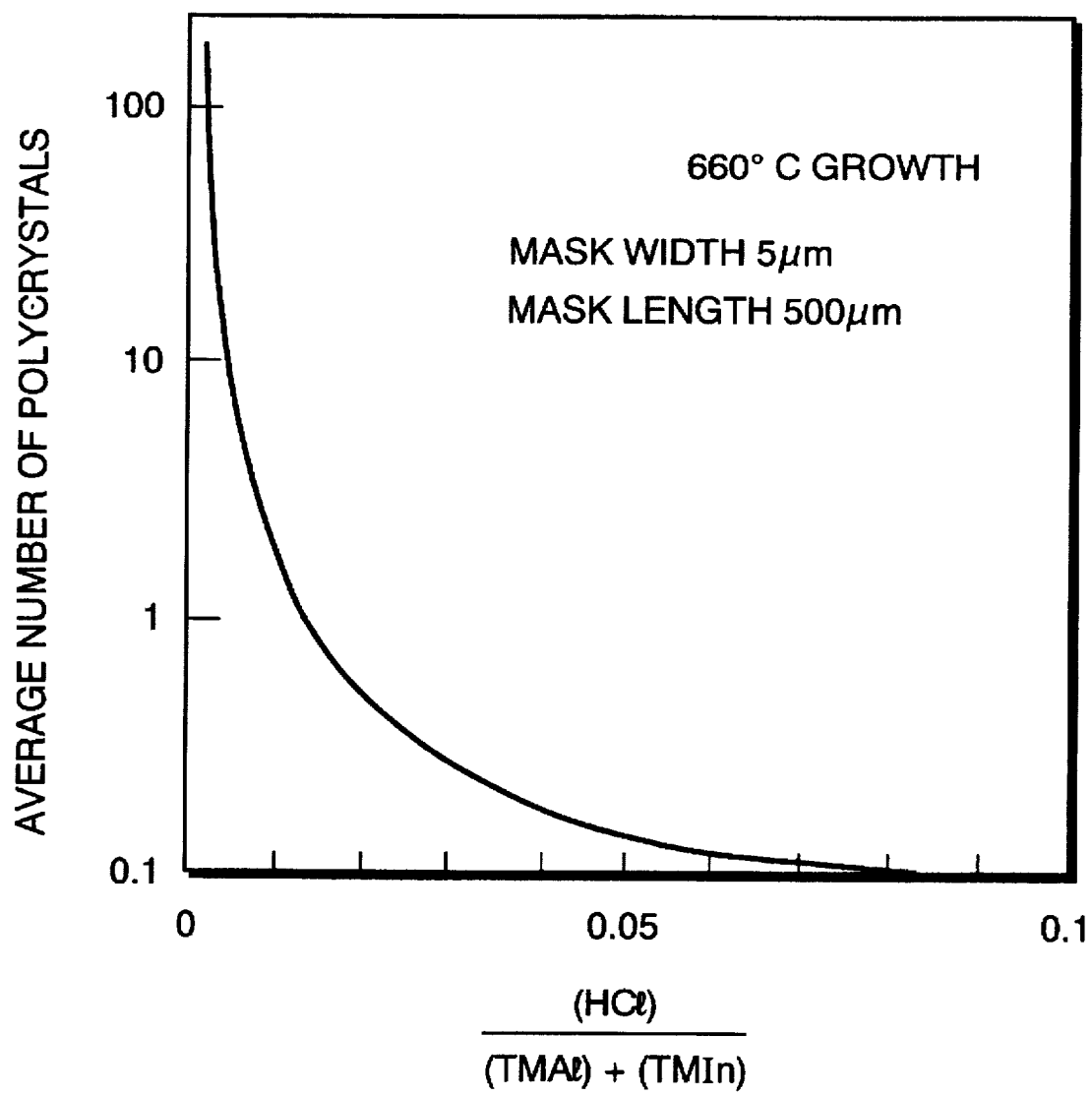
FIG. 3 is a diagram showing a relation between an average number of polycrystalline AlInP deposited on a silicon nitride mask having 5 µm width and 500 µm length and a ratio of the HCl gas supply amount to the total supply amount of the group III metalorganic material during a selective crystal growth of $Al_xIn_{1-x}P$ using HCl gas.
Figure 4:
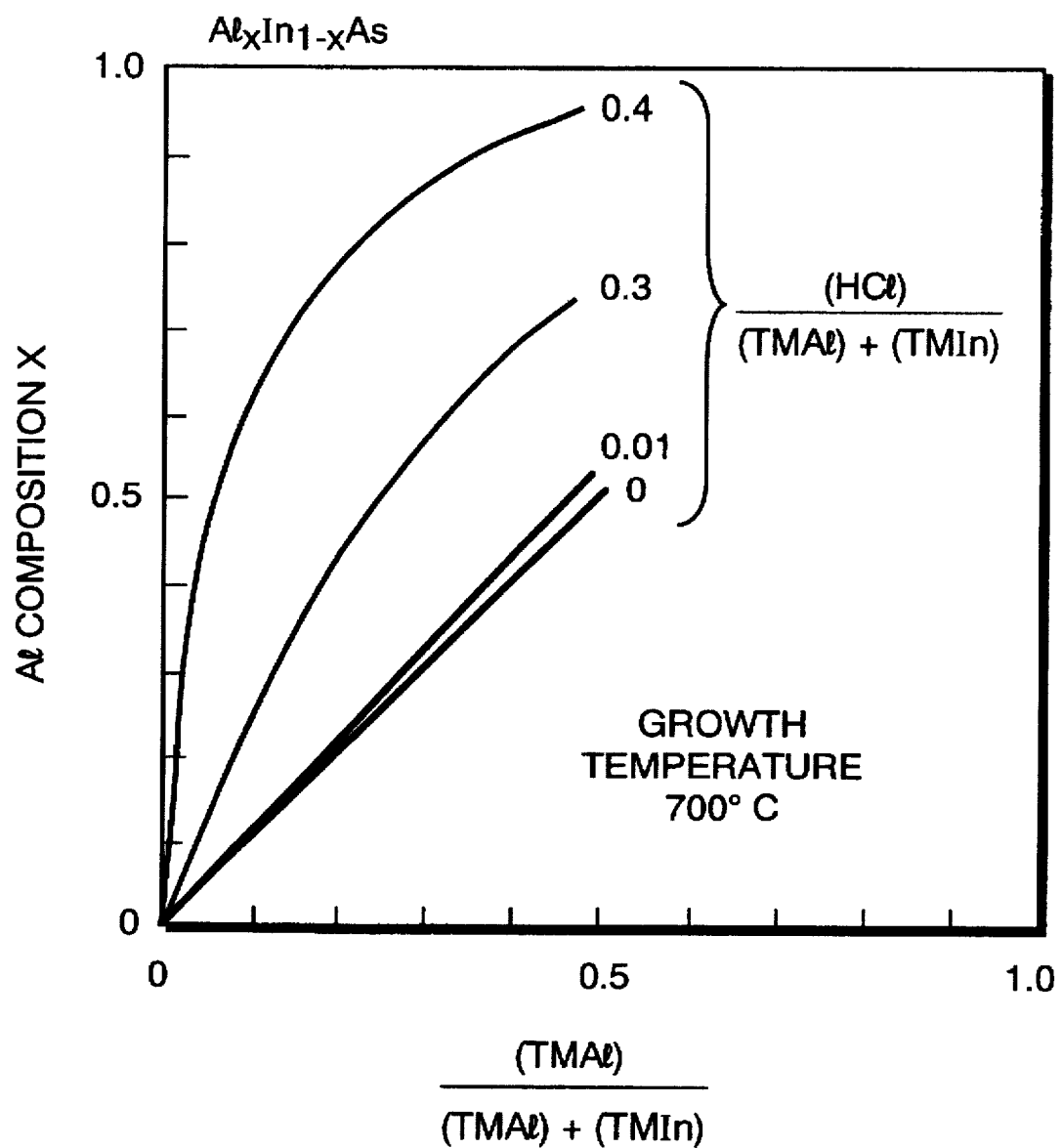
FIG. 4 is a diagram showing a relation between the Al composition of a $Al_xIn_{1-x}As$ film grown at a substrate temperature of 700° C. and a ratio of the TMAl supply amount to the total supply amount of the group III metalorganic material for different ratios of the HCl gas supply amount to the group III metalorganic material.

FIG. 4 shows a relation between the Al composition of $Al_xIn_{1-x}As$ grown by means of the MOVPE method with HCl gas and the ratio of trymethylaluminium (TMA) supply amount to the total supply amount of the group III metalorganic materials ([TMAl supply amount]/[group III supply amount]) (Al gaseous ratio). Note that the growth temperature of $Al_xIn_{1-x}As$ is 700° C. The curves shown in FIG. 3 depicts substantially the same tendencies as that of AlInP shown in FIG. 2, though both are slightly different from each other. Therefore, it is considered that a selective grown layer for practical use can be obtained by setting a value of [HCl supply amount]/[group III supply amount] below 0.3 in the same manner as in the case of AlInP. This point is predicted from the standard heat of formation (binding energy) of each group III–V compound semiconductor shown in Table 2 as follows. The difference between the binding energies of AlP and InP is as large as 21.3 kcal/mol so that composition mismatch is apt to be caused when HCl gas is added. Therefore, if the value of [HCl supply amount]/[group III supply amount] is suppressed below 0.3, it is considered that composition control of compounds, the constituents of which has binding energy differences below 21.3 kcal/mol, can be successfully carried out. In the case of AlInP, since the binding energy difference between. AlAs and InAs is 15.5 kcal/mol, the present invention is applicable to AlInP.

In the preceding embodiment of the present invention, the crystal growths of AlInP and AlInAs are described above for explaining the present invention. However, when binding energy differences of each compound semiconductor are calculated from the values of the binding energies shown in Table 2, it is expected that selective growth layers of crystals of AlInAsP etc., as well as the above-mentioned selective growth layer of AlGaInP, can be obtained for practical use, by virtue of the present invention.

TABLE 2

| | | | | | (Unit: Kcal/mol) |
|---|---|---|---|---|---|
| AlN | −76.1 | GaN | −26.2 | InN | −33.0 |
| AlP | −39.3 | GaP | −29.2 | InP | −18.0 |
| AlAs | −29.3 | GaAs | −19.5 | InAs | −13.8 |
| AlSb | −12.0 | GaSb | −10.0 | InSb | −7.44 |

What is claimed is:

1. A selective crystal growth method of a III–V compound semiconductor containing at least Al and In, in which
   an HCl gas, a group III metalorganic material, and a group V material are supplied on a semiconductor substrate having a surface portion partially covered with an insulating film to form said compound semiconductor on a surface portion not covered with said insulating film, wherein a ratio of said HCl gas supply amount to a total supply amount of the group III metalorganic material is set in the range of 0.01 to 0.3, and said compound semiconductor is lattice matched with said semiconductor substrate.

2. A selective crystal growth method of an AlInP compound semiconductor, in which an HCl gas, a group III metalorganic material, and a phosphorus material are supplied on a GaAs substrate having a surface portion partially covered with an insulating film to form said compound semiconductor on a surface portion not covered with said insulating film, wherein a ratio of said HCl gas supply amount to a total supply amount of the group III metalorganic material is set in the range of 0.01 to 0.3, and said AlInP compound semiconductor is lattice matched with said GaAs substrate.

3. The selective crystal growth method as set forth in claim 2, wherein the Al composition of said AlInP compound semiconductor is in a range of 0.48 to 0.52.

4. A selective crystal growth method of an AlGaInP compound semiconductor, in which an HCl gas, a group III metalorganic material, and a group V material are supplied on a GaAs substrate having a surface portion partially covered with an insulating film to form said compound semiconductor on a surface portion not covered with said insulating film, wherein a ratio of said HCl gas supply amount to a total supply amount of the group III metalorganic material is set in the range of 0.01 to 0.3, said AlGaInP compound semiconductor is lattice matched with said GaAs substrate, and a ratio Al to Ga composition of said AlGaInP compound semiconductor is larger than 2.33.

5. The selective crystal growth method as set forth in claim 4, wherein the substrate temperature during said selective crystal growth is in the range of 630° to 720° C.

6. A selective crystal growth method of an AlInAs compound semiconductor, in which an HCl gas, a group III metalorganic material, and an arsenic material are supplied on an InP substrate having a surface portion partially covered with an insulating film to form said compound semiconductor on a surface portion not covered with said insulating film, wherein a ratio of said HCl gas supply amount to a total supply amount of the group III metalorganic material is set in the range of 0.01 to 0.3, said AlInAs compound semiconductor is lattice matched with said InP substrate.

7. The selective crystal growth method as set forth in claim 6, wherein the Al composition of said AlInAs compound semiconductor is in a range of 0.46 to 0.48.

* * * * *